United States Patent
Lang et al.

(10) Patent No.: US 7,344,996 B1
(45) Date of Patent: Mar. 18, 2008

(54) HELIUM-BASED ETCH PROCESS IN DEPOSITION-ETCH-DEPOSITION GAP FILL

(75) Inventors: Chi-I Lang, Sunnyvale, CA (US); Wenxian Zhu, Palo Alto, CA (US); Ratsamee Limdulpaiboon, Daly City, CA (US); Judy H. Huang, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 267 days.

(21) Appl. No.: 11/159,834

(22) Filed: Jun. 22, 2005

(51) Int. Cl.
*H01L 21/302* (2006.01)
*H01L 21/461* (2006.01)

(52) U.S. Cl. ............... 438/723; 438/424; 427/469; 427/578; 216/64

(58) Field of Classification Search ......... 438/424, 438/427, 694, 695
See application file for complete search history.

(56) References Cited

U.S. PATENT DOCUMENTS

| | | | |
|---|---|---|---|
| 4,361,461 A | 11/1982 | Chang | |
| 5,129,958 A | 7/1992 | Nagashima et al. | |
| 5,227,191 A | 7/1993 | Nagashima | |
| 5,246,885 A | 9/1993 | Braren et al. | |
| 5,252,178 A | 10/1993 | Moslehi | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldivar | |
| 5,494,854 A | 2/1996 | Jain | |
| 5,516,729 A | 5/1996 | Dawson et al. | |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |
| 5,851,344 A | 12/1998 | Xu et al. | |
| 5,858,876 A | 1/1999 | Chew | |
| 5,869,902 A | 2/1999 | Lee et al. | |

(Continued)

FOREIGN PATENT DOCUMENTS

JP 2003-031649 1/2003

OTHER PUBLICATIONS

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

(Continued)

*Primary Examiner*—Brook Kebede
*Assistant Examiner*—Phillip S. Green
(74) *Attorney, Agent, or Firm*—Beyer Weaver LLP

(57) ABSTRACT

Plasma etch processes incorporating helium-based etch chemistries can remove dielectric a semiconductor applications. In particular, high density plasma chemical vapor etch-enhanced (deposition-etch-deposition) gap fill processes incorporating etch chemistries which incorporate helium as the etchant that can effectively fill high aspect ratio gaps while reducing or eliminating dielectric contamination by etchant chemical species.

10 Claims, 7 Drawing Sheets

U.S. PATENT DOCUMENTS

| | | |
|---|---|---|
| 5,872,058 A | 2/1999 | Van Cleemput et al. |
| 5,897,370 A | 4/1999 | Joshi et al. |
| 5,910,020 A | 6/1999 | Yamada |
| 5,911,133 A | 6/1999 | Soble |
| 5,913,140 A | 6/1999 | Roche et al. |
| 5,920,792 A | 7/1999 | Lin |
| 5,937,323 A | 8/1999 | Orczyk et al. |
| 5,953,635 A | 9/1999 | Andideh |
| 5,962,923 A | 10/1999 | Xu et al. |
| 5,963,840 A | 10/1999 | Xia et al. |
| 5,968,610 A | 10/1999 | Liu et al. |
| 5,972,192 A | 10/1999 | Dubin et al. |
| 6,027,663 A | 2/2000 | Martin et al. |
| 6,030,881 A | 2/2000 | Papasouliotis et al. |
| 6,037,018 A | 3/2000 | Jang et al. |
| 6,077,451 A | 6/2000 | Takenaka et al. |
| 6,077,574 A | 6/2000 | Usami |
| 6,100,205 A | 8/2000 | Liu et al. |
| 6,106,678 A | 8/2000 | Shufflebotham et al. |
| 6,124,211 A | 9/2000 | Butterbaugh et al. |
| 6,136,703 A | 10/2000 | Vaartstra |
| 6,149,779 A | 11/2000 | Van Cleemput |
| 6,184,158 B1 | 2/2001 | Shufflebotham et al. |
| 6,200,412 B1 | 3/2001 | Kilgore et al. |
| 6,211,065 B1 | 4/2001 | Xi et al. |
| 6,232,196 B1 | 5/2001 | Raaijmakers et al. |
| 6,265,269 B1 | 7/2001 | Chen et al. |
| 6,277,764 B1 | 8/2001 | Shin et al. |
| 6,331,494 B1 | 12/2001 | Olson et al. |
| 6,335,261 B1 | 1/2002 | Natzle et al. |
| 6,395,150 B1 | 5/2002 | Van Cleemput et al. |
| 6,400,023 B2 | 6/2002 | Huang |
| 6,410,446 B1 | 6/2002 | Tsai et al. |
| 6,451,705 B1 | 9/2002 | Trapp et al. |
| 6,479,361 B1 | 11/2002 | Park |
| 6,479,396 B1 | 11/2002 | Xu et al. |
| 6,486,081 B1 | 11/2002 | Ishikawa et al. |
| 6,500,728 B1 | 12/2002 | Wang |
| 6,531,377 B2 | 3/2003 | Knorr et al. |
| 6,566,229 B2 | 5/2003 | Hong et al. |
| 6,569,777 B1 | 5/2003 | Hsu et al. |
| 6,596,653 B2 | 7/2003 | Tan et al. |
| 6,596,654 B1 | 7/2003 | Bayman et al. |
| 6,599,829 B2 | 7/2003 | Smith et al. |
| 6,617,207 B1 | 9/2003 | Kiryu et al. |
| 6,642,105 B2 | 11/2003 | Kim et al. |
| 6,706,541 B1 | 3/2004 | Toprac et al. |
| 6,737,334 B2 | 5/2004 | Ho et al. |
| 6,787,483 B1 | 9/2004 | Bayman et al. |
| 6,794,290 B1 | 9/2004 | Papasouliotis et al. |
| 6,808,748 B2 | 10/2004 | Kapoor et al. |
| 6,812,043 B2 | 11/2004 | Bao et al. |
| 6,821,905 B2 | 11/2004 | Pan et al. |
| 6,846,391 B1 | 1/2005 | Papasouliotis et al. |
| 6,846,745 B1 | 1/2005 | Papasouliotis et al. |
| 6,852,639 B2 | 2/2005 | Rudolph et al. |
| 6,867,086 B1* | 3/2005 | Chen et al. .............. 438/219 |
| 6,958,112 B2* | 10/2005 | Karim et al. ............ 204/192.3 |
| 7,001,854 B1 | 2/2006 | Papasouliotis et al. |
| 7,067,440 B1 | 6/2006 | Bayman et al. |
| 7,078,312 B1 | 7/2006 | Sutanto et al. |
| 7,122,485 B1 | 10/2006 | Papasouliotis et al. |
| 7,135,409 B2* | 11/2006 | Komagata ................. 438/706 |
| 7,148,155 B1 | 12/2006 | Tarafdar et al. |
| 7,163,896 B1* | 1/2007 | Zhu et al. .................. 438/694 |
| 2001/0019903 A1 | 9/2001 | Shufflebotham et al. |
| 2001/0044203 A1 | 11/2001 | Huang et al. |
| 2002/0052119 A1 | 5/2002 | Van Cleemput |
| 2002/0084257 A1 | 7/2002 | Bjorkman et al. |
| 2002/0179570 A1 | 12/2002 | Mathad et al. |
| 2002/0187657 A1 | 12/2002 | Morozumi |
| 2003/0003244 A1 | 1/2003 | Rossman |
| 2003/0003682 A1 | 1/2003 | Moll et al. |
| 2003/0087506 A1 | 5/2003 | Kirchhoff |
| 2003/0165632 A1 | 9/2003 | Lin et al. |
| 2003/0203652 A1 | 10/2003 | Bao et al. |
| 2003/0207580 A1 | 11/2003 | Li et al. |
| 2004/0020894 A1 | 2/2004 | Williams et al. |
| 2004/0058549 A1 | 3/2004 | Ho et al. |
| 2004/0082181 A1 | 4/2004 | Doan et al. |
| 2004/0110390 A1 | 6/2004 | Takagi et al. |
| 2004/0241342 A1 | 12/2004 | Karim et al. |
| 2005/0074946 A1* | 4/2005 | Chu et al. .................. 438/424 |
| 2005/0130411 A1 | 6/2005 | Bao et al. |
| 2005/0136576 A1 | 6/2005 | Ishihara et al. |
| 2005/0136686 A1 | 6/2005 | Kim et al. |
| 2005/0250346 A1 | 11/2005 | Schmitt |

OTHER PUBLICATIONS

Guari et al., "Method of Preventing Structures Erosion During Multi-Step Gap Fill", Novellus Systems, Inc., filed Dec. 4, 2003, U.S. Appl. No. 10/728,569, pp. 1-29.

Bayman et al., "Gap Fill For High Aspect Ratio Structures", Novellus Systems, Inc., filed Jul. 13, 2004, U.S. Appl. No. 10/890,655, pp. 1-24.

Sutanto et al., "Method For Controlling Etch Process Repeatability", Novellus Systems, Inc., filed Sep. 2, 2003, U.S. Appl. No. 10/654,113, pp. 1-31.

Bayman et al., "Process Modulation to Prevent Structure Erosion During Gap Fill", Novellus Systems, Inc., filed Sep. 7, 2004, U.S. Appl. No. 10/935,909, pp. 1-30.

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-µm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

Papasoulitotis et al., "Deposition Profile Modification Through Process Chemistry", Novellus Systems, Inc., filed Dec. 9, 2002, U.S. Appl. No. 10/316,987, pp. 1-35.

Zhu et al., "Biased $H_2$ Etch Process In Deposition-Etch-Deeposition Gap Fill", Novellus Systems, Inc., filed Dec. 10, 2003, U.S. Appl. No. 10/733,858, pp. 1-28.

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

Lang et al., "Using Water (H20) To Replace Oxygen (02) In A Silicon Dioxide (SiO2) Thin Film Deposition Process for HDP STI Technology", Novellus Systems, Inc., filed Nov. 9, 2005, U.S. Appl. No. 11/272,487, pp. 1-25.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

Yu et al., "Stress Profile Modulation in STI Gap Fill," Novellus Systems, Inc., U.S. Appl. No. 11/471,958, filed Jun. 20, 2006, pp. 1-27.

* cited by examiner

HELIUM-BASED ETCH PROCESS IN DEPOSITION-ETCH-DEPOSITION GAP FILL

BACKGROUND OF THE INVENTION

This invention relates to semiconductor device fabrication processes. More specifically, the invention relates to plasma-based chemical vapor deposition and etch processes for forming dielectric layers, particularly in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of narrow width, high aspect ratio (AR) spaces (e.g., AR>3:1) becomes increasingly difficult due to limitations of existing deposition processes.

The deposition of silicon dioxide ($SiO_2$) assisted by high-density plasma chemical vapor deposition (HDP CVD)—a directional (bottom-up) CVD process—has become the preferred method for high aspect ratio gap fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

An etch-enhanced (deposition-etch-deposition) gap fill technique which involves a sequence of deposition, etch and deposition steps using an HDP reactor has been developed to maintain the opening at the top of the gap wide enough for a subsequent deposition(s) to completely fill the gap. Such processes are described, for example, in U.S. Pat. Nos. 6,335,261 and 6,030,881, the disclosures of which are incorporated herein by reference for all purposes. A typical 3-step etch-enhanced process can be described as follows: First step—Deposition 1: a partial deposition of SiO2 thin film is conducted to obtain maximum bottom-up gap fill with the gap remaining unclosed; second step—Etch: in-situ etch back is carried out to remove depositions on the top and sidewall of the trench lines and keep the mouth of the gap open enough for the next deposition step with minimum bottom-up deposition loss; and, third step—Deposition 2: deposition of $SiO_2$ film is carried out to further fill the partially filled gap to completion. In some cases it may be necessary to conduct additional etch and deposition steps to completely fill the gap.

The etch component of these etch-enhanced gap fill processes typically uses a fluorine-based etchant, such as $NF_3$, $CF_4$ or $C_2F_6$, etc., to achieve a fast etch rate. However, the application of those etchants may contaminate the dielectric (e.g., STI) film with foreign atoms, e.g., C, N and F, causing issues in the subsequent integration processes and device degradation.

Therefore, an etch-enhanced gap fill process that avoided the use of etchants which tend to contaminate the deposited dielectric film would be desirable.

SUMMARY OF THE INVENTION

The present invention addresses this need by providing chemical vapor deposition and biased etch back processes that replace fluorine-based etchants with a helium-based etch chemistry. He is the major or only component of the etch process chemistry and primary or only etchant. The etch process chemistry may also include an inert carrier gas, such as Ar or $N_2$, and/or an etch process modulator, such as a minor component of $H_2$ or $O_2$. The process modulating gases may alter the character of the etch, such as by stabilizing the plasma or reducing the etch rate.

In one aspect, the invention pertains to a method of filling gaps on a semiconductor substrate in accordance with the present invention involves:

(a) partially filling a gap on a semiconductor substrate with a dielectric using a high density plasma chemical vapor deposition process;

(b) partially removing dielectric deposited in the gap from the gap opening by an etch back process conducted with a halogen-free etch process chemistry comprising a helium: hydrogen ratio of greater than 1; and (c) further filling of the partially filled gap by a high density plasma chemical vapor deposition process.

The invention provides a high density plasma chemical vapor etch-enhanced gap fill process using hydrogen as an etchant that can effectively fill high aspect ratio (typically at least 3:1, for example 6:1, and up to 10:1 or higher), narrow width (typically sub 0.11 micron, for example 0.1 micron or less) gaps while reducing or eliminating dielectric contamination by etchant chemical species.

Suitable plasma reactors, e.g., Novellus Speed, with inductively coupled plasma (ICP) sources are available to accomplish both deposition and etch steps of the etch-enhanced gap fill process of the present invention in a single plasma reactor chamber. The deposition part of the process may involve the use of any suitable high density plasma chemical vapor deposition (HDP CVD) chemistry.

The process results in the formation of a dielectric film free of contamination by etchant chemical species.

These and other features and advantages of the present invention are described below where reference to the drawings is made.

DETAILED DESCRIPTION OF SPECIFIC EMBODIMENTS

Figure 1A:
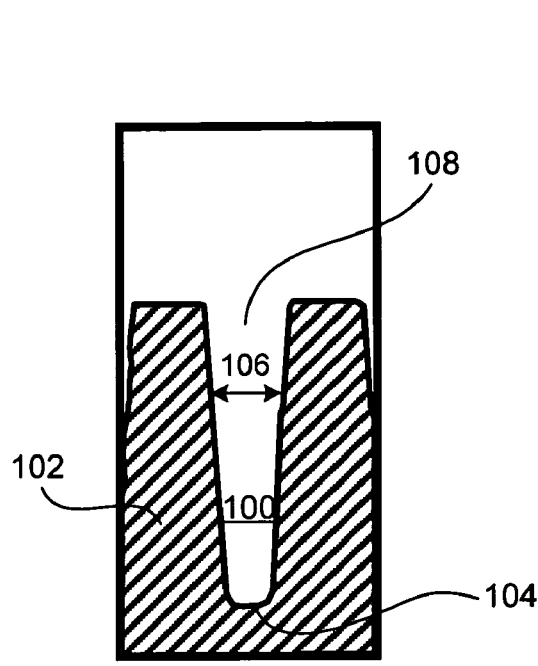
FIGS. 1A-D depict rough schematic cross-sectional diagrams of an etch-enhanced gap fill process in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention addresses this need by providing chemical vapor deposition and biased etch back processes that replace fluorine-based etchants with a helium-based etch chemistry. He is the major or only component of the etch process chemistry and primary or only etchant. A method of filling gaps on a semiconductor substrate in accordance with the present invention involves:

(a) partially filling a gap on a semiconductor substrate with a dielectric using a high density plasma chemical vapor deposition process;

(b) partially removing dielectric deposited in the gap from the gap opening by an etch back process conducted with a halogen-free etch process chemistry comprising a helium:hydrogen ratio of greater than 1; and (c) further filling of the partially filled gap by a high density plasma chemical vapor deposition process.

Previously, helium (He) was thought to be an inert gas in etch chemistries. However, it has now been found that helium gas (He) has the ability to serve as sputter source and to be an effective etchant in its own right. With sufficiently high source power, helium gas provides He atoms to be ionized and therefore create high ion energy and high flux density. Ionized He can be used to remove deposited dielectric (e.g., $SiO_2$) film on all surfaces of a patterned structure (e.g., a semiconductor substrate). The dielectric removal rate is enhanced by a biasing the substrate. Biasing increases sputtering efficiency and the removal rate is increased.

The invention provides a high density plasma chemical vapor etch-enhanced gap fill process using helium (helium ions) as the etchant that can effectively fill high aspect ratio (typically at least 3:1, for example 6:1, and up to 10:1 or higher), narrow width (typically sub 0.11 micron, for example 0.1 micron or less) gaps while reducing or eliminating dielectric contamination by etchant chemical species.

Suitable plasma reactors, e.g., Novellus Speed, with inductively coupled plasma (ICP) sources are available to accomplish both deposition and etch steps of the etch-enhanced gap fill process of the present invention in a single plasma reactor chamber. The gap fill process of the present invention may also be accomplished in a plurality of processing chambers. The deposition part of the process may involve the use of any suitable high density plasma chemical vapor deposition (HDP CVD) chemistry.

The process results in the formation of a dielectric film free of contamination by etchant chemical species.

Etch-Enhanced Gap Fill Process

FIGS. 1A-D depict rough schematic cross-sectional diagrams of a multi-step, etch-enhanced gap fill process in accordance with the present invention. FIG. 1A depicts a trench (gap) 100 on a semiconductor substrate 102 requiring filling with a dielectric. The gap may be defined by its features, namely its bottom 104, sidewalls 106 and entry region (top) 108. The gap 100 is generally lined with a barrier layer, such as thermal silicon dioxide ($SiO_2$) and ($Si_3N_4$) silicon nitride. As such, a thin layer (e.g., 10-200 Å, for example 100 Å) of silicon dioxide is formed on the gap bottom 104 and sidewalls 106 prior to being filled with bulk dielectric. A pad nitride also generally exists at the entry region 108, on the substrate surface surrounding the gap 100.

The present invention, while applicable to the filling of any gap requiring dielectric fill, is particularly suited to gap fill of high aspect ratio, narrow width gaps. For example, the gap 100 may have a high aspect ratio, for example about 6:1 and a narrow width, for example about 1000 Å.

Figure 1B:
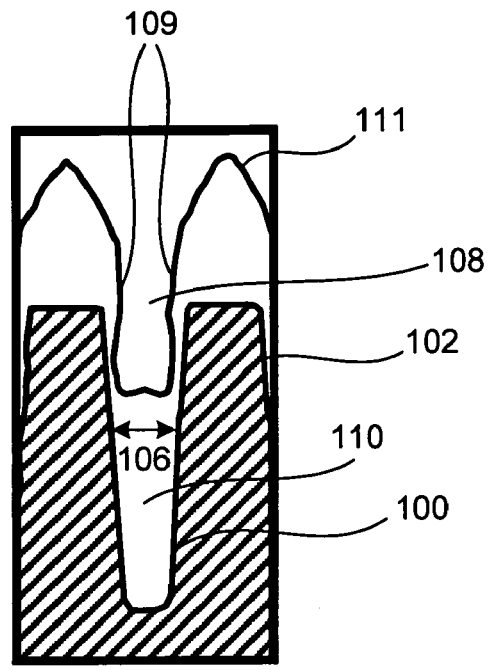

In an initial step in a multi-step gap fill process in accordance with the present invention, the gap 100 is partially filled with a dielectric 110 deposited by high density plasma (HDP) chemical vapor deposition (CVD) process, as shown in FIG. 1B. The dielectric may be composed of any suitable material including doped (e.g., with fluorine, phosphine or phosphine and borine) or undoped $SiO_2$ or $Si_3N_4$, PSG BPSG or FSG. The present invention may be particularly useful in applications where undoped dielectrics (e.g., $SiO_2$) are desirable, for example, in some FLASH memory devices. Generally, a high density plasma is any plasma having electron density of at least about $1 \times 10^{12}$ electrons per cubic centimeter. Typically, though not necessarily, high density plasma reactors operate at relatively low pressures, in the range of 100 mTorr or lower, and generally below 30 mTorr.

The deposition process gas will have a particular composition represented by flow rates of the constituent gases in units of standard cubic centimeter per minute (sccm). The process gas will include a precursor for the deposition layer. If the dielectric is a silicon-containing dielectric, like silicon dioxide ($SiO_2$), then the process gas will include a silicon-bearing compound. Examples of silicon-containing dielectric precursors are well known in the art and include $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. Where the purity of the dielectric is an issue, inorganic, non-fluorine-containing precursors for $SiO_2$, such as $SiH_4$ and $Si_2H_6$, are preferred. During deposition, the process decomposes the silicon-containing reactant to form a silicon-containing gas and plasma phase species, which can react on the surface of the substrate.

The process gas will also generally include a carrier gas. The carrier gas may be an inert gas, such as He, Ar and/or other noble gases. Or the carrier gas may be or include elemental or molecular hydrogen.

Oxygen to form the silicon dioxide or other dielectric material may be provided by the silicon-containing precursor itself or from another process gas such as oxygen ($O_2$), nitric oxide (NO), and/or nitrous oxide ($N_2O$). Again, where the purity of the dielectric is an issue, oxygen ($O_2$) is the preferred oxygen source.

Typical flow rate ranges for deposition process gases of the present invention are listed below.

| Gas | Flow Rate (sccm) |
|---|---|
| $SiH_4$ | 10-300 |
| $O_2$ | 20-1000 |
| He | 0-500 |
| $H_2$ | 0-2000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 150 sccm.

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700-750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 700° C., even more preferably between about 350 and 650° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0-15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the induction coil typically varies from 1 kW to 20 kW, and the high frequency power (for biasing the wafer) typically varies from 0.5 kW to 10 kW depending on the substrate size (e.g., 200 or 300 mm diameter) and the requirements of the specific process being used.

The power source applied to the induction coil and substrate electrode is typically a radio frequency source. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The power source applied to the induction coil typically has a frequency range between about 300 kHz and 1 MHz. In a preferred embodiment, the deposition process chemistry is as follows:

| Gas | Flow Rate (sccm) |
|---|---|
| $SiH_4$ | 80 |
| He | 200 |
| $H_2$ | 100 |
| $O_2$ | 110 |

The low frequency coil is powered at 3000 W and the high frequency substrate electrode is powered at 800 W. Further details of suitable HDP CVD deposition process gas chemistries are provided below.

The HDP CVD deposition results in beneficial filling of the trench from the bottom 104 up. However, there is still some problematic top and sidewall deposition resulting in narrowing of the entry region 108 of the gap 100 by the formation of an overhang 109 and the formation of a dielectric peak (the so-called "top-hat" feature) 109 on either side of the gap opening. This results from the non-directional deposition reactions of neutral species in the plasma reactor and from sputtering/redeposition processes. The overhang 109 and top-hat 111 features exacerbate the difficulties of filling the high aspect ratio gap.

To address these problems, following this initial deposition stage of the process, the detrimental overhang 109 is removed and the top-hat 111 substantially reduced in an etch back stage of the process to facilitate further void free filling of the trench in a subsequent deposition stage. In a preferred embodiment, the etch back process is carried out in the same reactor chamber as the deposition.

He as Etchant

According to the present invention, helium is used as an etching agent to replace conventional F-containing etchants in a biased etch back stage of the gap fill process. He is introduced into the deposition chamber and ionized by source plasma power in the chamber. The ionized helium acts as an etchant for deposited dielectric film on all exposed surfaces of the substrate 102 on which the gap 100 is being filled. In accordance with the present invention, He is the major or only component of the etch process chemistry and primary or only etchant. The etch process chemistry may also include an inert carrier gas, such as Ar or $N_2$, and/or an etch process modulator, such as a minor component of $H_2$ or $O_2$, but no other etchant (e.g., F-based etchant) is used.

Figure 1C:
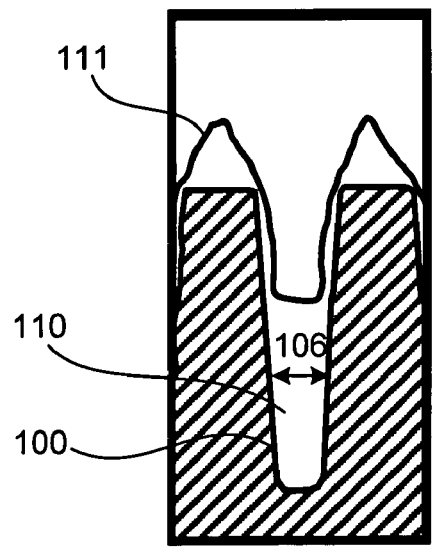

In the biased etch back stage, the wafer is biased and exposed to a plasma, for example, a radio frequency based inductively coupled plasma, containing He-based etchant chemistry. As shown in FIG. 1C, there is partial removal of deposited dielectric film, primarily in the overhang and top-hat areas at the top of the gap, by the He etch. The efficiency of the etch may be increased by biasing the substrate and the etch rate increases with the bias power. This He-based etching leads to efficient removal of unnecessary deposition at and adjacent to the gap opening in order to maintain the gap open enough for a complete gap fill in a subsequent HDP CVD deposition stage(s) of the multi-step process.

The chuck may be biased with a power range of about 1000 to 7000 W. Biasing the chuck imparts some directionality to the etch plasma towards the wafer on the biased chuck. Thus, while the etch process of the present invention has a dominant isotropic character, it does favor the biased wafer/chuck. Increase in bias power enhances etch rate, but does not significantly alter the isotropic characteristic of He etch. This is observed by the conservation of bottom-up deposition even with high bias power He etch processing. This process advantage shows that He ions are small enough to cause negligible bombardment/sputtering of the dielectric material that is normal to the incoming ions, while efficient in removing the "top-hat" area that is about 45-60° to the incoming ions. The biased etch process is referred to herein as substantially isotropic.

He is the major or only component of the etch process chemistry and primary or only etchant. The etch process chemistry may also include an inert carrier gas, such as Ar or $N_2$, and/or an etch process modulator, such as a minor component of $H_2$ or $O_2$. The process modulating gases may alter the character of the etch, such as by stabilizing the plasma or reducing the etch rate. $O_2$ should only be used to the extent necessary to achieve plasma stability since its addition enhances the redeposition effect.

In some specific embodiments, a He-only etch chemistry is used. In other embodiments, a $He/H_2$ etch process chemistry is used. When hydrogen ($H_2$) is present as an etch process gas, the etch process chemistry has a helium:hydrogen ratio of greater than 1. In many cases, the helium:hydrogen ratio will be greater than 2 or greater than 3.

Typical process parameter ranges for a suitable inductively coupled He-based etch chemistry plasma process gas mixture in accordance with one embodiment of the present invention, and associated reactor conditions, are listed as follows:

| | |
|---|---|
| Wafer temp (° C.) | 250-700 |
| He (sccm) | 500-1500 |
| $H_2$ (sccm) | 0-500 |
| $O_2$ (sccm) | 0-500 |
| Pressure (mTorr) | 0.2-10 |
| Bias (HF RF) Power (W) | 1000-7000 |
| Source (LF) Power (W) | 4000-10,000 |

When a 200 mm wafer is being etched, the source power is preferably at least about 4000 KW. When a 300 mm wafer is being etched, the source power is preferably at least about 6000 KW.

An example of suitable etch plasma process chemistry and reactor conditions for a 200 mm wafer is as follows:

| | |
|---|---|
| Wafer temp (° C.) | 600 |
| He (sccm) | 1000 |
| $H_2$ (sccm) | 0 |
| Pressure (mTorr) | 3 |
| Bias (HF RF) Power (W) | 3000 |
| Source (LF) Power (W) | 7000 |

An example of suitable etch plasma process chemistry and reactor conditions for a 300 mm wafer is as follows:

| | |
|---|---|
| Wafer temp (° C.) | 600 |
| He (sccm) | 1500 |
| $H_2$ (sccm) | 0 |
| Pressure (mTorr) | 4 |
| Bias (HF RF) Power (W) | 5000 |
| Source (LF) Power (W) | 9500 |

The conditions are preferably set so that the etch is selective for the HDP CVD deposited dielectric (e.g., $SiO_2$) relative to the silicon nitride barrier layer lining the trench and the hard mask (the pad nitride on the substrate surface surrounding the gap opening) so that neither is exposed and clipped by the etch. Adjustment of the process selectivity is within the skill in the art given the process parameters and description provided herein.

Figure 1D:
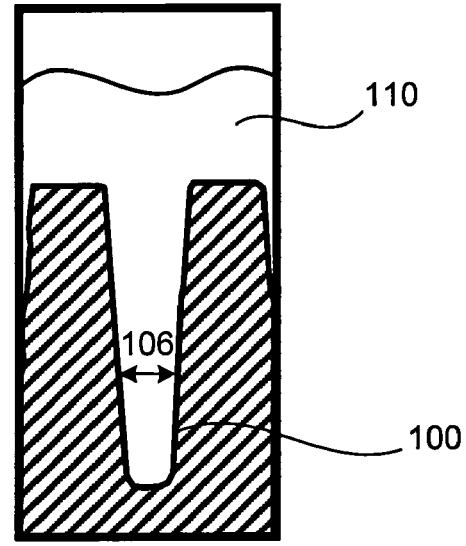

Following the He-based etch back stage, an additional HDP CVD deposition is performed in order to further fill the gap 100 with dielectric 110, as shown in FIG. 1D. The etch back and deposition steps depicted in FIGS. 1C and 1D may be repeated, as necessary, until the gap is filled. For a gap with about a 6:1 aspect ratio and about a 1000 Å width, three to five, for example four, iterations of the etch back and deposition steps are typical to obtain void free filling of the gap.

Without limiting the invention described and claimed herein, some beneficial effects of the use of helium as an etchant in accordance with the present invention are illustrated with reference to FIGS. 2-5.

Figure 2:
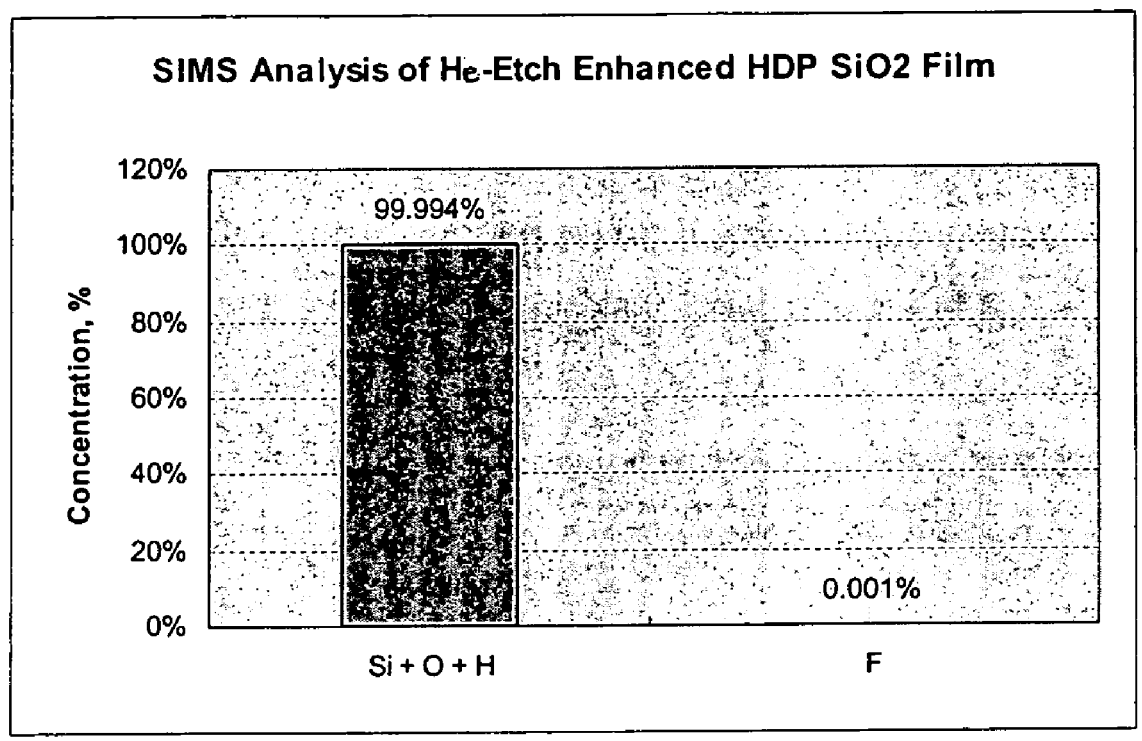
FIG. 2 depicts a SIMS analysis plot showing F content in an HDP film deposited using an He-etch enhanced gap fill process in accordance with one embodiment of the present invention.

FIG. 2 provides a plot of the secondary ion mass spectroscopy (SIMS) analysis result of an HDP film formed using an He-based etch-enhanced gap fill process in accordance with the invention showing that there is only trace amount of F (0.001%) contained in the dielectric film $SiO_2$. This illustrates that the etch may be accomplished without any substantial contamination of the deposited dielectric as may be the case when fluorine based etchants are used.

Figure 3:
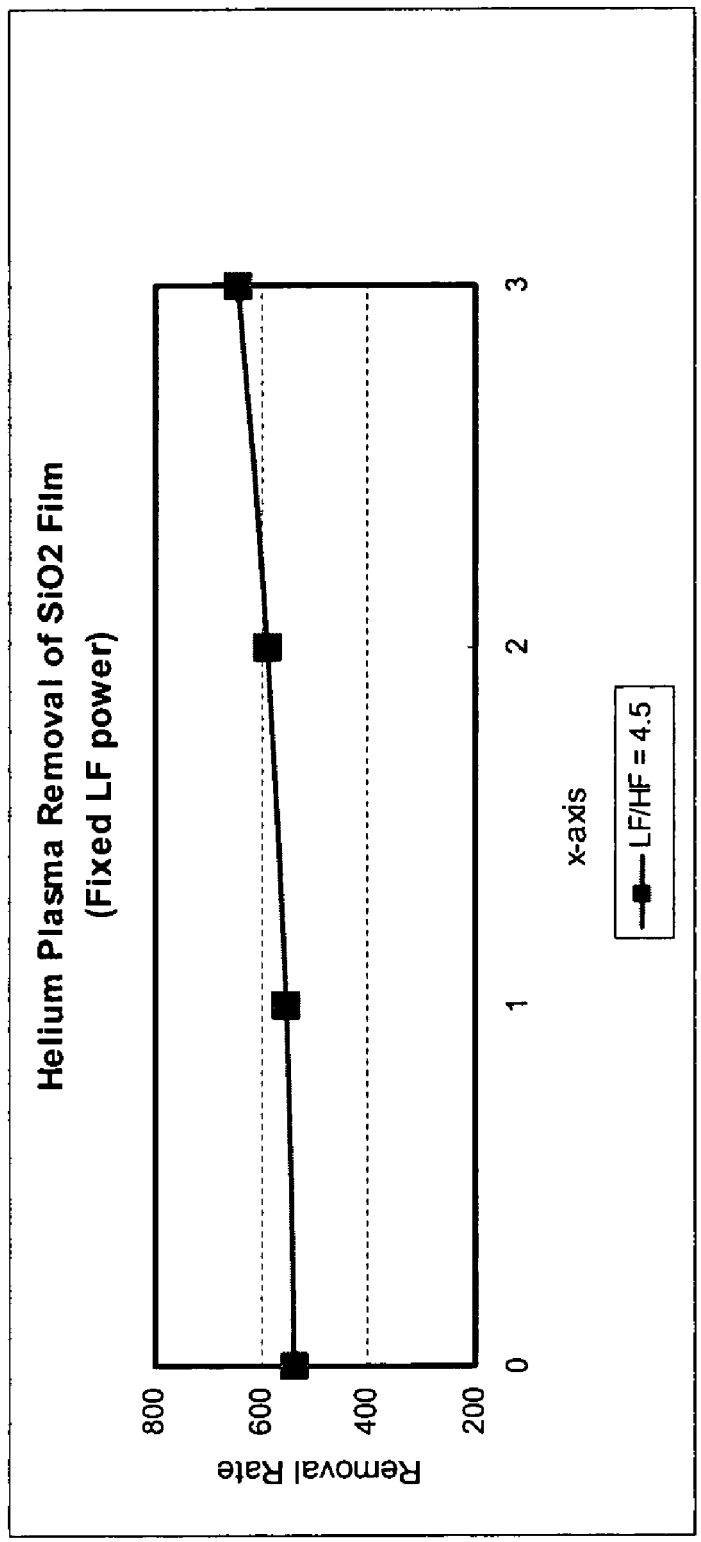
FIG. 3 depicts a plot showing He-based plasma $SiO_2$ removal rate profile vs. distance from wafer center for an He-etch enhanced gap fill process in accordance with one embodiment of the present invention.

FIG. 3 illustrates the within wafer (WIW) uniformity of the He-based etch technique of the present invention. The etch rate was measured at forty nine points across a 200 mm wafer from the center of the wafer (0) to the edge of the wafer (3) for a process conducted using an He only etch chemistry at source/bias ratio of 4.5. The measurement points were averaged and plotted in FIG. 3 As can be seen in the plot, the WIW uniformity of the process is very high. The helium-based plasma etch helps reduce or avoid clipping at the wafer center when the desired removal amount on the edge is reached on a structure wafer.

Figure 4:
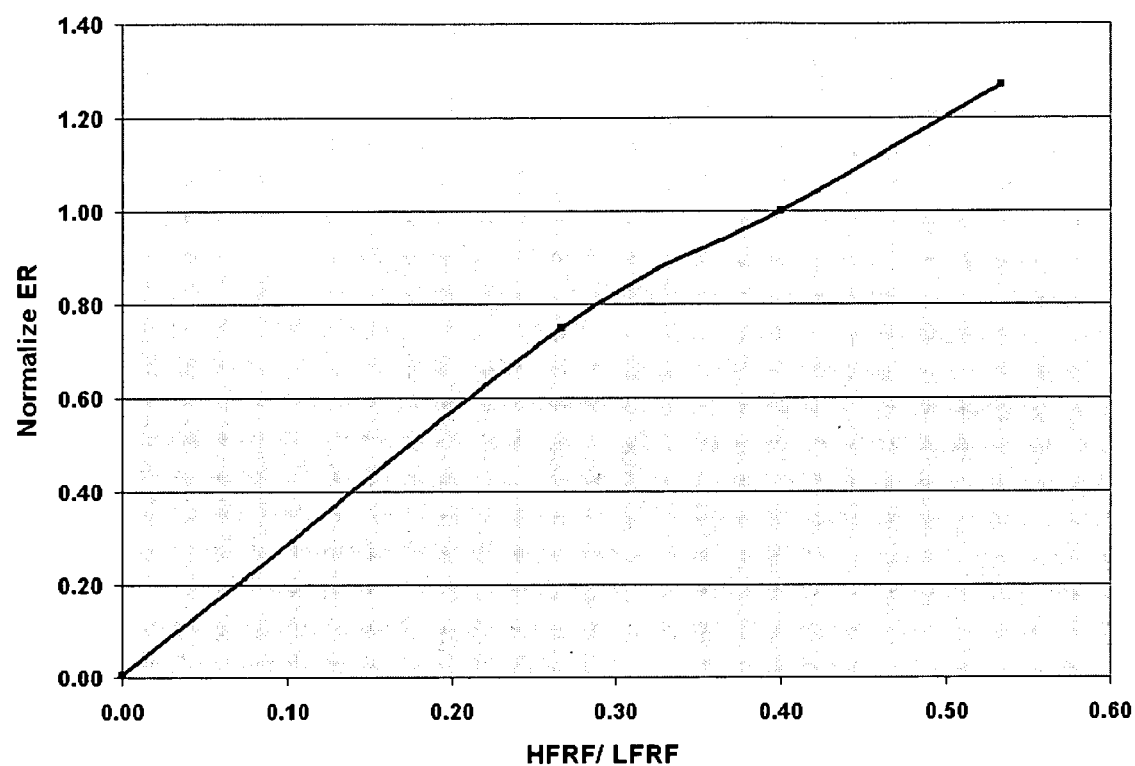
FIG. 4 depicts a plot of normalized etch rate vs. the ratio of applied bias (HFRF) to source (LFRF) power for an He-etch enhanced gap fill process in accordance with one embodiment of the present invention.
Figure 5:
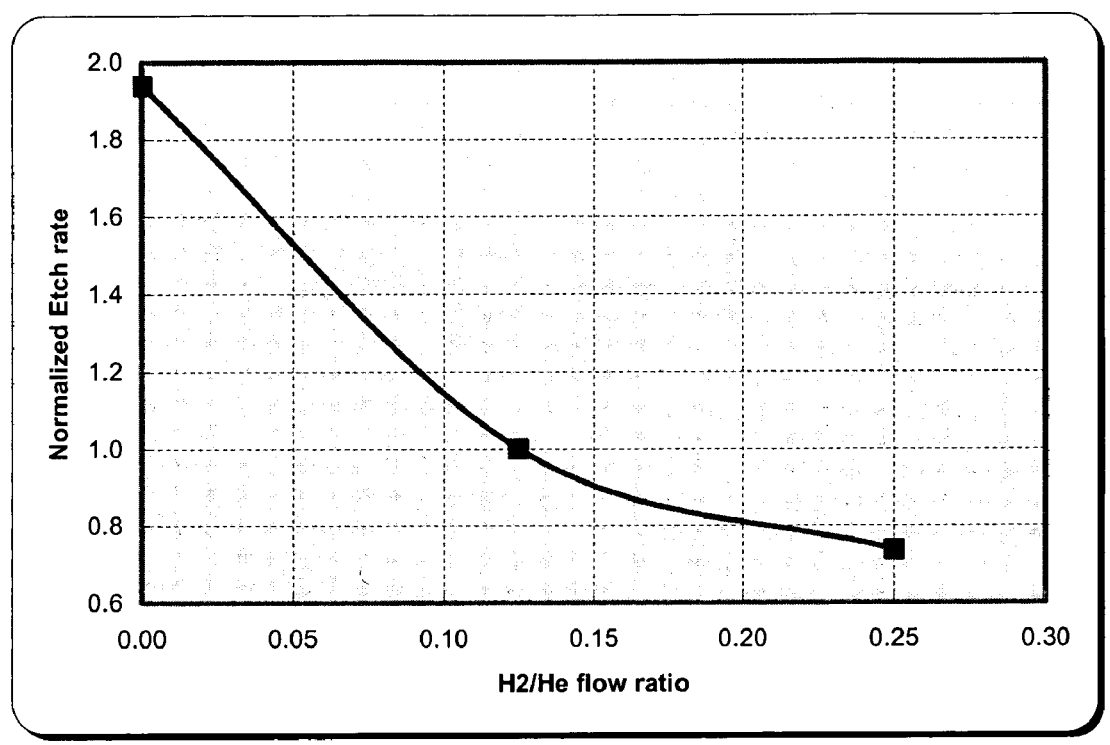
FIG. 5 depicts a plot of normalized etch rate vs. the ratio of $H_2$ to He flow rate in the plasma etch process gas for an He-etch enhanced gap fill process in accordance with one embodiment of the present invention.

FIGS. 4 and 5 illustrate etch rate changes with adjustments to the etch conditions. From FIG. 4, it can be seen that the etch rate increases substantially linearly with increasing bias power (increased LF/HF ratio). From FIG. 5, it can be seen that the addition of hydrogen ($H_2$) to the etch process gas mixture modulates the process, slowing the etch rate. While the invention is not limited to any particular theory of operation, it is believed that $H_2$ provides a chemical etch component and a passivating component; the chemical etch capability of $H_2$ ions leads to more isotropic removal of deposited film, while the passivating capability of H ions to any dangling bonds of the deposited surface leads to minimization of redeposition. These effects can be used to adjust the etch performance as desired by a particular user for a particular application.

Thus, this invention provides an etch-enhanced HDP gap fill (e.g., STI) process with an in situ high throughput He-based etch step without dielectric contamination.

Implementation: Plasma Processing Reactor

Various plasma reactor designs are suitable for use with this invention. The particular design is not critical to this invention. It merely needs to support HDP CVD dielectric layer formation and etch back on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors and described, for example, in U.S. Pat. Nos. 5,346,578, 5,405,480 and 5,605,599, the disclosures of which are incorporated by reference herein in their entirety and for all purposes.

Figure 6A:
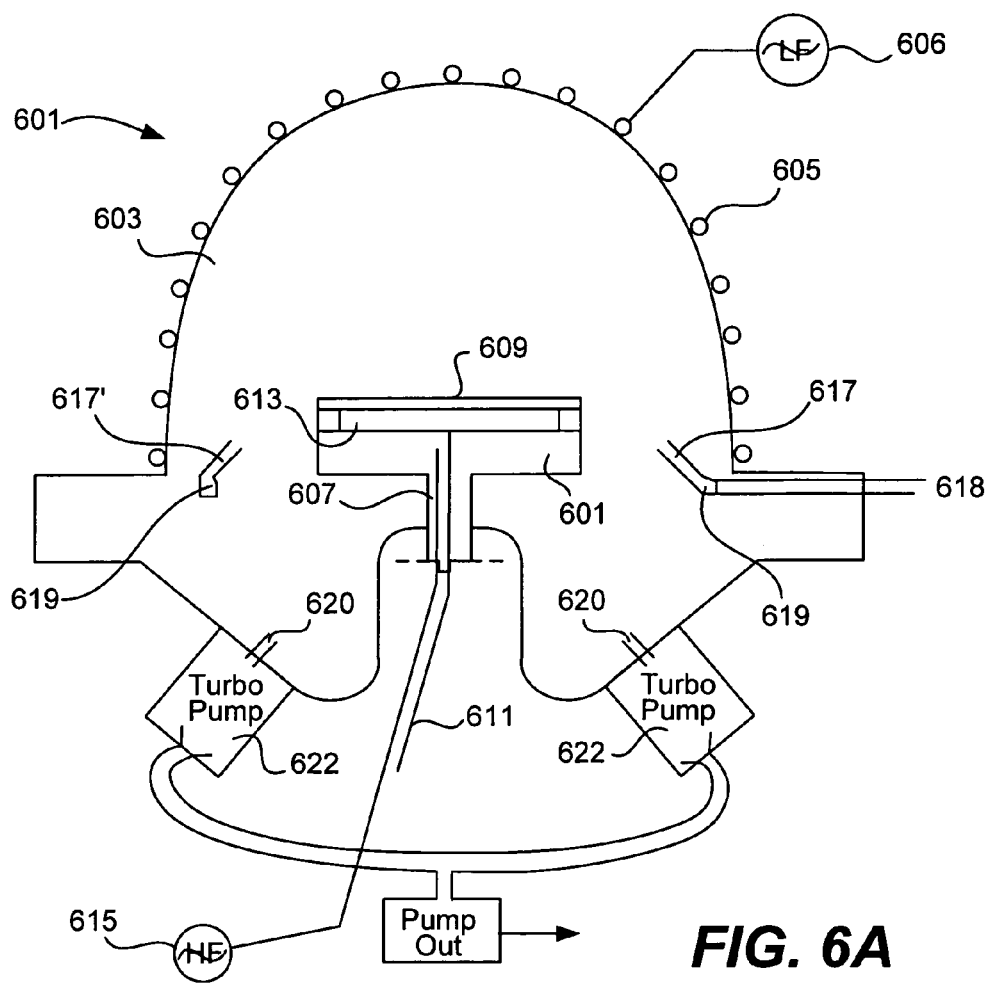
FIG. 6A is a vertical cross-sectional block diagram depicting some components of a plasma processing system suitable for conducting a dep-etch-dep gap fill process in accordance with the present invention.

FIG. 6A is a vertical cross-section block diagram depicting some components of a suitable plasma processing reactor suitable for conducting an $H_2$ etch-enhanced gap fill process in accordance with the present invention on semiconductor wafers. As shown, the reactor 601 includes a process chamber 603 which encloses other components of the reactor and serves to contain the plasma generated by the radio frequency power source coupled to the induction coil 605 which surrounds the chamber on or embedded in the chamber walls. In one example, the process chamber walls are made from aluminum, aluminum oxide, and/or other suitable material. The coil 605 is powered by a "low frequency" radio frequency (RF) source 606. The power and frequency supplied by source 606 is sufficient to generate high-density plasma from the process gas.

Within the reactor, a wafer pedestal 607 supports a substrate 609. The pedestal typically includes a chuck 608 to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer gas controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition or etch reactions. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate with a power ranges from 0.5 kW to 10 kW.

Figure 6B:
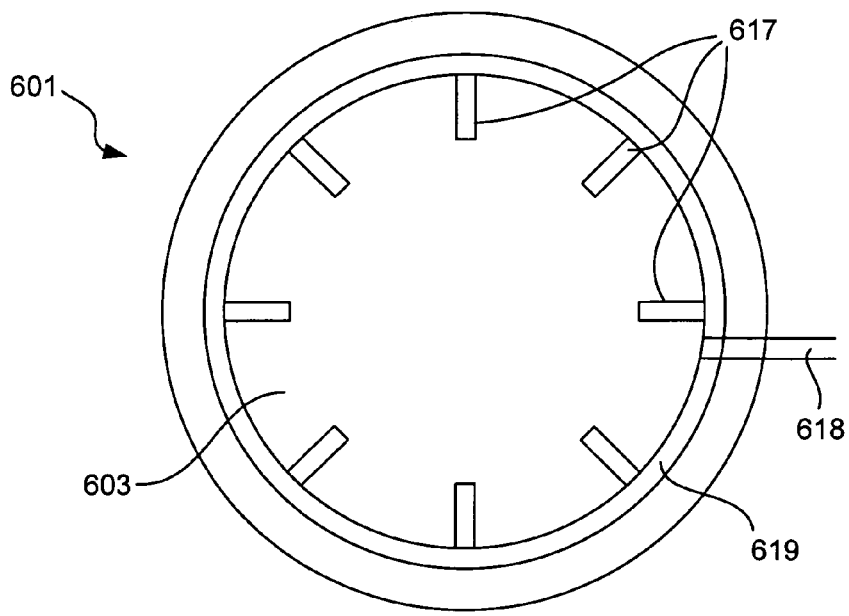
FIG. 6B is a horizontal cross-section schematic diagram of the plasma processing system of FIG. 6A.

The process gases are introduced via one or more chamber inlets 617. The gases may be premixed or not. A source of hydrogen gas provides hydrogen for the deposition and etch process gas. Other sources of dielectric precursor gases and carrier gases are also provided. Preferably, the process gas is introduced through a gas supply inlet mechanism including orifices. The gas or gas mixture may be introduced from a primary gas ring, which may or may not direct the gas toward the substrate surface. In this embodiment, a ring inlet(s) 618 is connected to the primary gas ring 619 to supply gas or gas mixture into the chamber via the chamber inlets 617. This arrangement is further illustrated in the horizontal cross-section of FIG. 6B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 603 via an outlet or outlets 620. A vacuum pump (e.g., a turbomolecular pump) or pumps 622 typically draws the gas out and maintains a suitably low pressure within the reactor.

As noted above, the gap fill process of the present invention is preferably accomplished in a single reactor process chamber, but it may also be accomplished in a plurality of processing chambers. When more than one processing chamber is used, a pressure controlled transfer module should be used to transfer the wafers from one chamber to another. Such transfer modules and procedures are known to those of skill in the art.

Process Parameters

Figure 7:
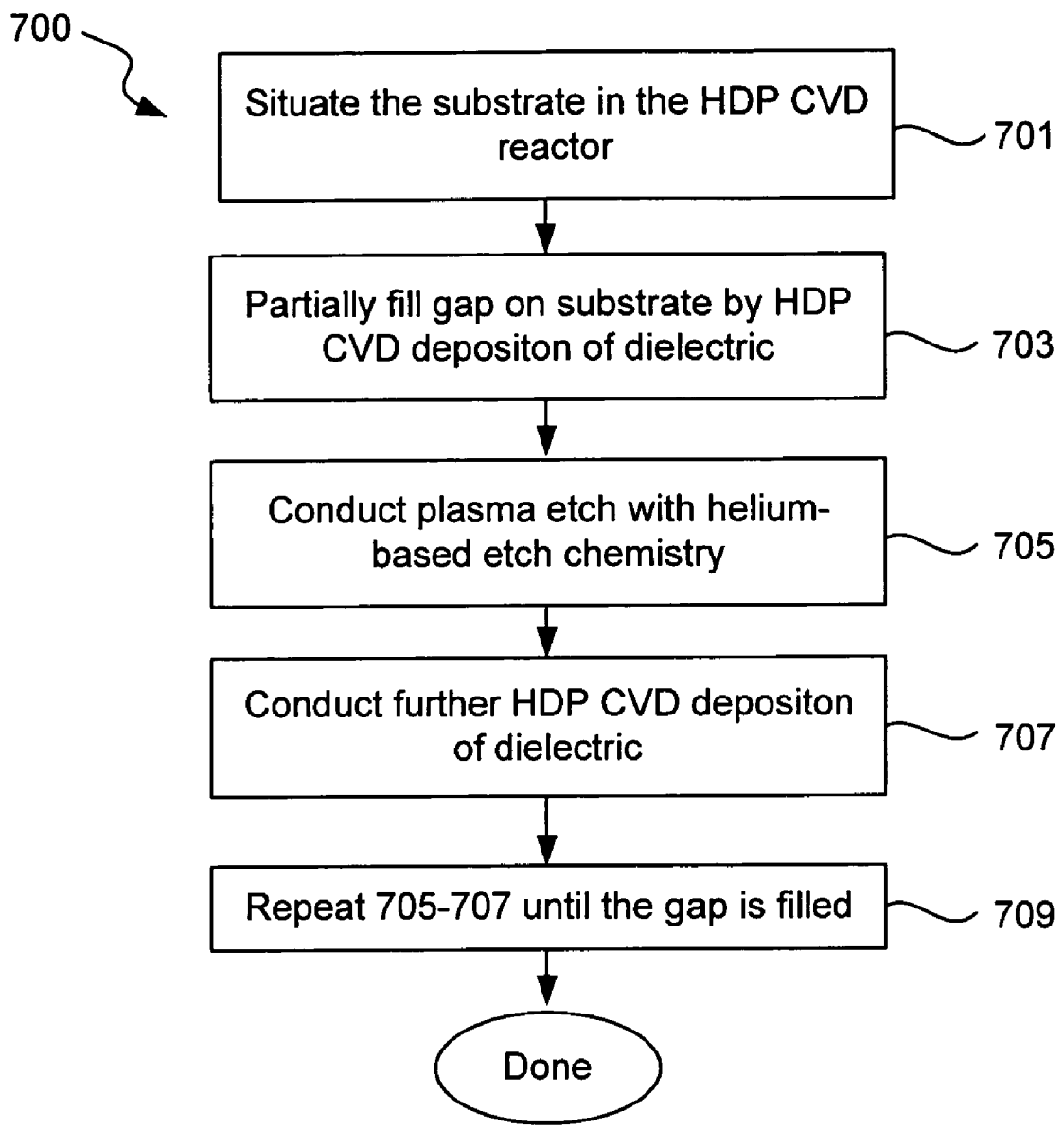
FIG. 7 is a process flow diagram depicting a process context of the present invention.

FIG. 7 is a process flow diagram (700) depicting a process context of the present invention. Reference is made to the system depicted in FIG. 6A throughout the description of this process flow as a sample context for implementation of the invention. A substrate requiring gap filling, such as a semiconductor wafer, is situated in an HDP CVD reactor (701).

A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters. Providing the substrate to the reactor may involve clamping the substrate to a pedestal or other support in the chamber. For this purpose, an electrostatic or mechanical chuck may be employed.

After the wafer is appropriately situated in the chamber, a gap on the substrate is partially filled by HDP CVD deposition of dielectric (703). The process adjusts the substrate temperature to a level promoting the deposition of the dielectric layer. Typically, this temperature is between about 30-1000° C. (more preferably about 300 to 680° C., for example 450-550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

The reactor system introduces a process gas to the reaction chamber via an inlet. The process gas includes dielectric precursor species such as high vapor pressure silicon-containing compounds. Molecular oxygen or another oxygenated compound will often be present. A carrier gas is also generally present. The carrier gas may be an inert carrier gas such as helium. However, in high aspect ratio gap fill applications the carrier gas preferably is or includes molecular or elemental hydrogen which inhibits precursor dissociation and promotes bottom-up gap fill. All the process gas components are introduced at specified flow rates.

An electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the induction coil is powered by a lower frequency RF source.

Dielectric is deposited in the gap or gaps on the substrate to a desired thickness, generally at the point where the overhang that forms at the gap entry point prevents further effective filling of the gap (703).

After finishing the deposition step, the flow of deposition chemistry is turned off and the helium-based etchant chemistry is introduced to the reaction chamber via an inlet to begin the plasma etch (705). The He etchant gas should dissociate at a controlled rate consistent with isotropic etching. Molecular hydrogen or oxygen may also be present in the etchant chemistry, but should be minimized. All the process gas components are introduced at specified flow rates within the parameters noted above. In a specific embodiment, the isotropic etch is conducted using an inductively coupled plasma source in the reactor. The RF bias and source powers in the reactor are adjusted to between about 1000 and 7000 W and 4000 and 10,000 W, respectively. It should be noted that the inductively coupled plasma (ICP) etch may alternatively be accomplished by a downstream microwave plasma etch. The etch back process preferentially removes dielectric overhang and top-hat features at the gap opening thereby decreasing the gap's aspect ratio and facilitating further filling in subsequent deposition processing.

Following the etch, etch process chemistry flows are turned off and further deposition process for filling the remaining gap is performed (707) by introducing the deposition process gases into the reactor. The etch back and deposition process (705-707) is then repeated until the gap is filled (709). For a gap with about a 6:1 aspect ratio and about a 1000 Å width, three to five, for example four, iterations of the etch back and deposition steps are typical to obtain void free filling of the gap.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), pre-metal dielectric (PMD), inter-metal layer dielectric (ILD) layers, passivation layers, etc.

As indicated, the invention can effectively fill gaps having widths of 0.15 microns or less, for example 0.1 micron or less, and aspect ratios of 3:1 or greater, for example 5:1, 6:1, or even 10:1 or greater. More aggressive structures having, e.g., greater aspect ratios and smaller widths may also be used. In one example the gap width is 0.15 micrometers or less, e.g., between 0.11 micrometer and 0.08 micrometer.

The dielectrics employed to fill those gaps will often be a silicon oxide such as silicon dioxide, silicon oxynitride, silicon oxyfluoride, and doped variants of each of these. Therefore, the scope of the invention includes at least phosphorus-doped, boron/phosphorus-doped oxides and fluorine/phosphorus-doped oxides. As indicated, the dielectric may also be a phosphorus- and boron-doped silicon oxide glass (BPSG).

Alternative Embodiments

While the invention is primarily described herein with reference to an etch-enhanced multi-step gap fill process, it should be understood that the He-based etch may also be conducted independent of the other steps of the gap fill process. For example, the He-based etch may be applied to etch a silicon-based dielectric in any appropriate context.

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising:
    (a) partially filling a gap on a semiconductor substrate with a dielectric using a high density plasma chemical vapor deposition process;
    (b) partially removing dielectric deposited in the gap from the gap opening by a net etch back process conducted with a halogen-free etch process chemistry comprising helium as the major component of the etch process chemistry, wherein the etch chemistry further comprises hydrogen at a helium:hydrogen ratio of greater than 1; and
    (c) further filling of the partially filled gap by a high density plasma chemical vapor deposition process.

2. The method of claim 1, wherein the etch process chemistry comprises a helium:hydrogen ratio of greater than 2.

3. The method of claim 1, wherein the etch process chemistry comprises a helium:hydrogen ratio of greater than 3.

4. The method of claim 1, wherein the deposited dielectric is silicon dioxide ($SiO_2$).

5. The method of claim 1, wherein the substrate is biased during the etch back process and the etch rate is determined by the substrate bias power.

6. The method of claim 5, wherein the etch rate increases with increasing substrate bias power.

7. The method of claim 1, wherein (b) and (c) are repeated until the gap is filled.

8. The method of claim 1, wherein the etch process chemistry further comprises an inert gas selected from the group consisting of Ar and $N_2$.

9. The method of claim 1, wherein the deposition and etch steps are conducted in a single plasma reactor process chamber.

10. The method of claim 9, wherein the plasma generated for deposition and etch is a radio frequency based inductively coupled plasma.

* * * * *